(12) United States Patent
Furubo et al.

(10) Patent No.: US 9,056,245 B2
(45) Date of Patent: Jun. 16, 2015

(54) ELECTRONIC APPARATUS

(75) Inventors: Takayuki Furubo, Chiba (JP);
Hirokuni Beppu, Chiba (JP)

(73) Assignees: SONY CORPORATION, Tokyo (JP);
SONY COMPUTER ENTERTAINMENT INC., Tokyo (JP)

( * ) Notice: Subject to any disclaimer, the term of this patent is extended or adjusted under 35 U.S.C. 154(b) by 222 days.

(21) Appl. No.: 13/559,772

(22) Filed: Jul. 27, 2012

(65) Prior Publication Data

US 2013/0033829 A1 Feb. 7, 2013

(30) Foreign Application Priority Data

Aug. 4, 2011 (JP) .................................. 2011-171287

(51) Int. Cl.
*H05K 7/02* (2006.01)
*A63F 13/90* (2014.01)

(52) U.S. Cl.
CPC .. *A63F 13/08* (2013.01); *H05K 7/02* (2013.01)

(58) Field of Classification Search
CPC .................................. H06F 1/16; H05K 7/02
USPC ..................... 361/752, 753, 760; 174/63–100
See application file for complete search history.

(56) References Cited

U.S. PATENT DOCUMENTS

| 5,825,635 | A * | 10/1998 | Mukoyama et al. | .......... | 361/826 |
| 6,456,499 | B1 * | 9/2002 | Nakajima et al. | ............. | 361/752 |
| 8,411,452 | B2 * | 4/2013 | Tsubota et al. | ............... | 361/753 |
| 8,684,842 | B2 * | 4/2014 | Takeda et al. | .................... | 463/39 |
| 2002/0036897 | A1 | 3/2002 | Nakajima et al. | | |
| 2007/0202956 | A1 * | 8/2007 | Ogasawara et al. | ............. | 463/46 |

FOREIGN PATENT DOCUMENTS

| CN | 1347280 | 5/2002 |
| JP | 56-49077 | 5/1981 |
| JP | 10-312781 | 11/1998 |
| JP | 2001-244644 | 9/2001 |
| JP | 2004-86674 | 3/2004 |
| JP | 2008-21804 | 1/2008 |

OTHER PUBLICATIONS

Japanese Office Action dated Jun. 11, 2013, from corresponding Japanese Application No. 2011-171287.
Chinese First Office Action dated Jul. 3, 2014 from corresponding Application No. 201210277252.X.

* cited by examiner

*Primary Examiner* — Jayprakash N Gandhi
*Assistant Examiner* — Mandeep Buttar
(74) *Attorney, Agent, or Firm* — Katten Muchin Rosenman LLP

(57) ABSTRACT

An electronic apparatus 1 includes a holder 50 arranged along the rear surface of a main board 20 and the front surface of a sub-board 30. The holder 50 includes a connector holder portion 51 that holds a connector 59 in a position offset in the thickness direction of the main board 20 and the sub-board 30 from a position on the rear surface of the main board 20 and a position on the front surface of the sub-board 30. The holder 50 includes a cable holder portion 52 that holds a cable 58. Consequently, it is possible to optimize the position of an electronic component such as a connector and prevent interference between a cable connected to the electronic component and other electronic components on a circuit board.

6 Claims, 13 Drawing Sheets

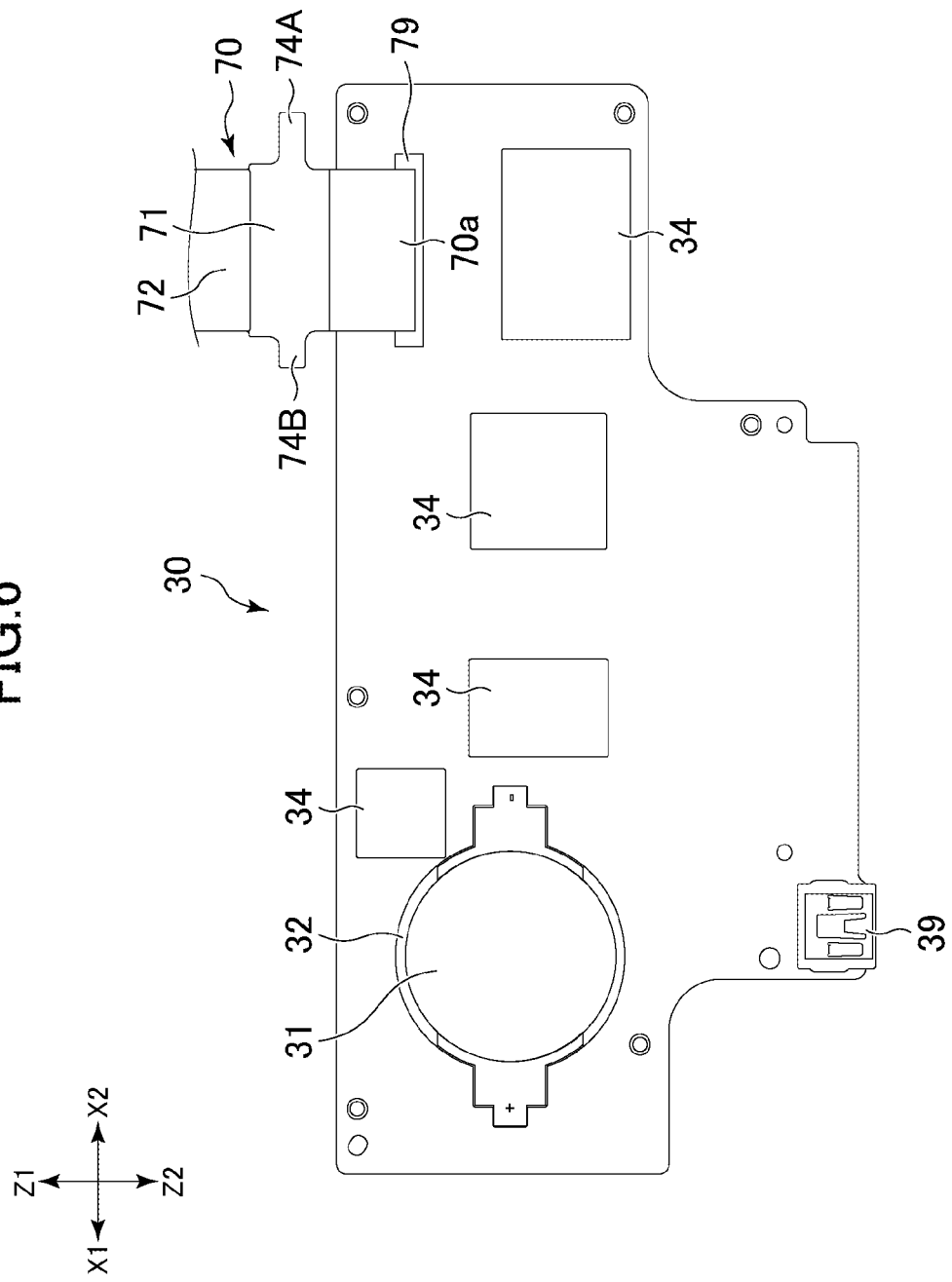

ELECTRONIC APPARATUS

CROSS-REFERENCE TO RELATED APPLICATION

The present application claims priority from Japanese application JP2011-171287 filed on Aug. 4, 2011, the content of which is hereby incorporated by reference into this application.

BACKGROUND OF THE INVENTION

1. Field of the Invention

The present invention relates to a structure for supporting an electronic component provided to be exposable on the outer surface of an electronic apparatus.

2. Description of the Related Art

United States Patent Application Publication No. 2007/0202956 discloses an electronic apparatus including a display screen on the front surface thereof. In the electronic apparatus, connectors for connecting the electronic apparatus to peripheral apparatuses are provided on the bottom surface and the side surfaces of a housing of the electronic apparatus. In some electronic apparatus of this type, connectors into which portable storage media can be inserted are provided on the bottom surface and the side surfaces of a housing of the electronic apparatus. The connectors are mounted on a circuit board and are exposable from the housing in a direction parallel to the circuit board.

SUMMARY OF THE INVENTION

In structure in which the connectors are mounted on the circuit board, the positions of these components in the thickness direction of the circuit board depend on the position of the circuit board in the housing. Accordingly, a degree of freedom of the positions of the connectors is low, and the positions depending on the position of the circuit board are not always desirable.

Further, in electronic apparatuses including a cable arranged on the inner side thereof is used, interference between the cable and electronic components mounted on the circuit board tends to be a problem.

An electronic apparatus according to an embodiment of the present invention includes: a circuit board; a housing configured to house the circuit board; an electronic component housed in the housing and exposable in a direction along the circuit board from an opening formed in the housing; a cable arranged in the housing and extending in a direction along the circuit board from the electronic component; and a holder arranged on one surface of the circuit board. The holder includes: a component holder portion which holds the electronic component in a position offset from a position on the one surface of the circuit board in the thickness direction of the circuit board; and a cable holder portion which holds the cable.

According to the above electronic apparatus, it is possible to optimize the position of the electronic component in the thickness direction of the circuit board and prevent interference between the cable and other electronic components.

BRIEF DESCRIPTION OF THE DRAWINGS

FIG. 6 is a front view of a circuit board (a sub-board);

DETAILED DESCRIPTION OF THE INVENTION

Figure 1:
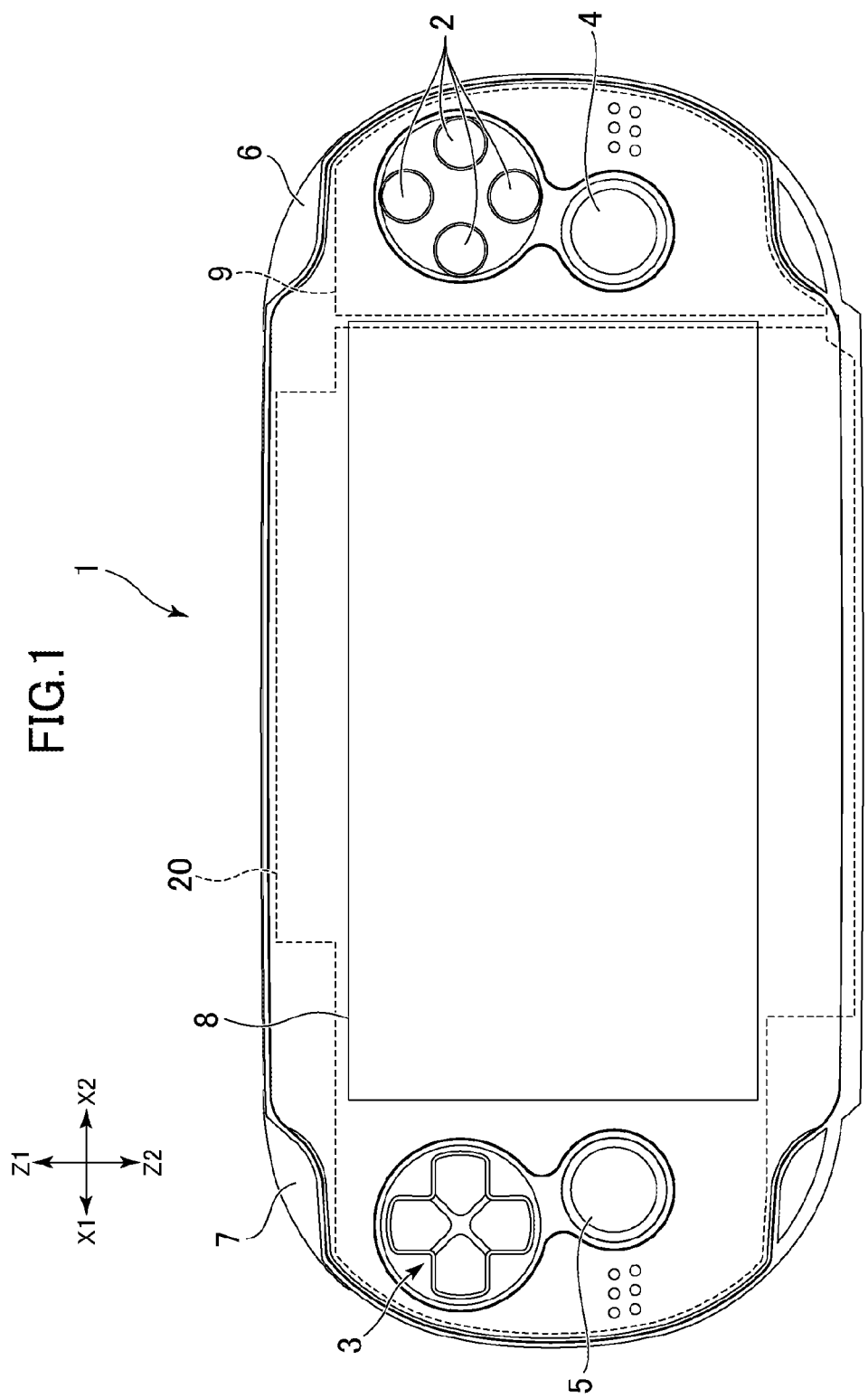
FIG. 1 is a front view of an electronic apparatus according to an embodiment of the present invention.
Figure 2:
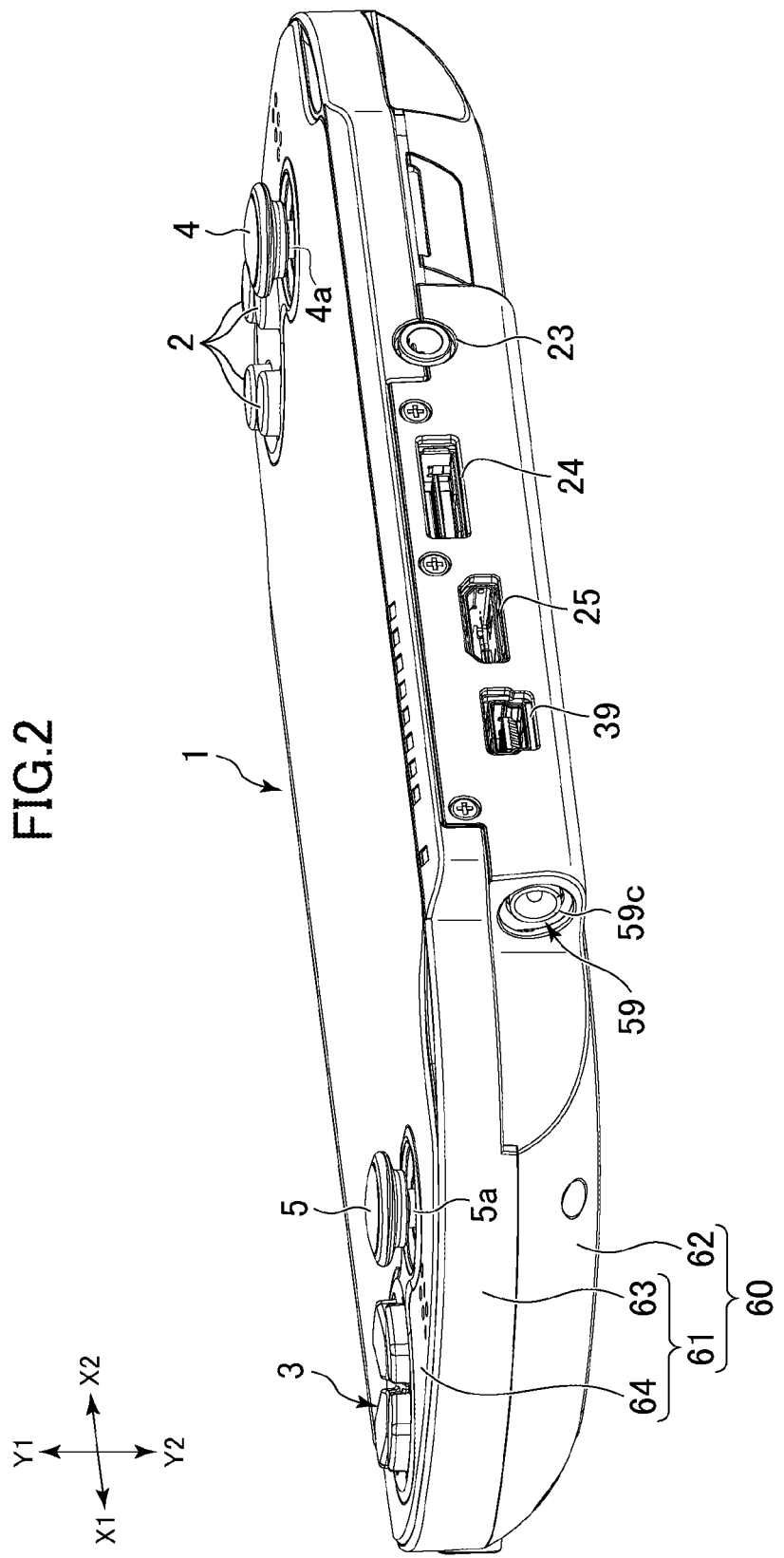
FIG. 2 is a perspective view of the electronic apparatus showing the lower surface thereof.
Figure 3:
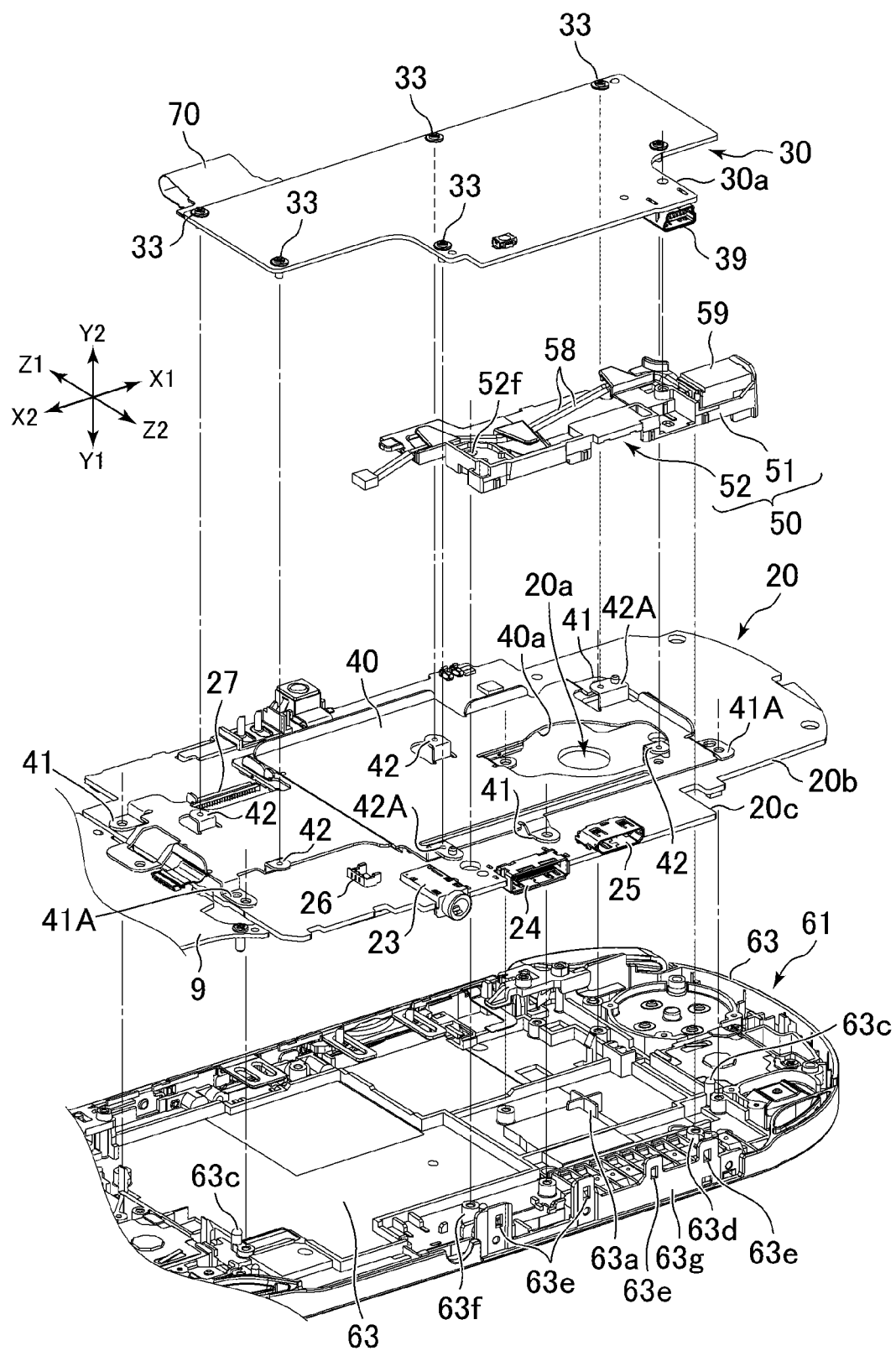
FIG. 3 is an exploded perspective view of the electronic apparatus.
Figure 4:
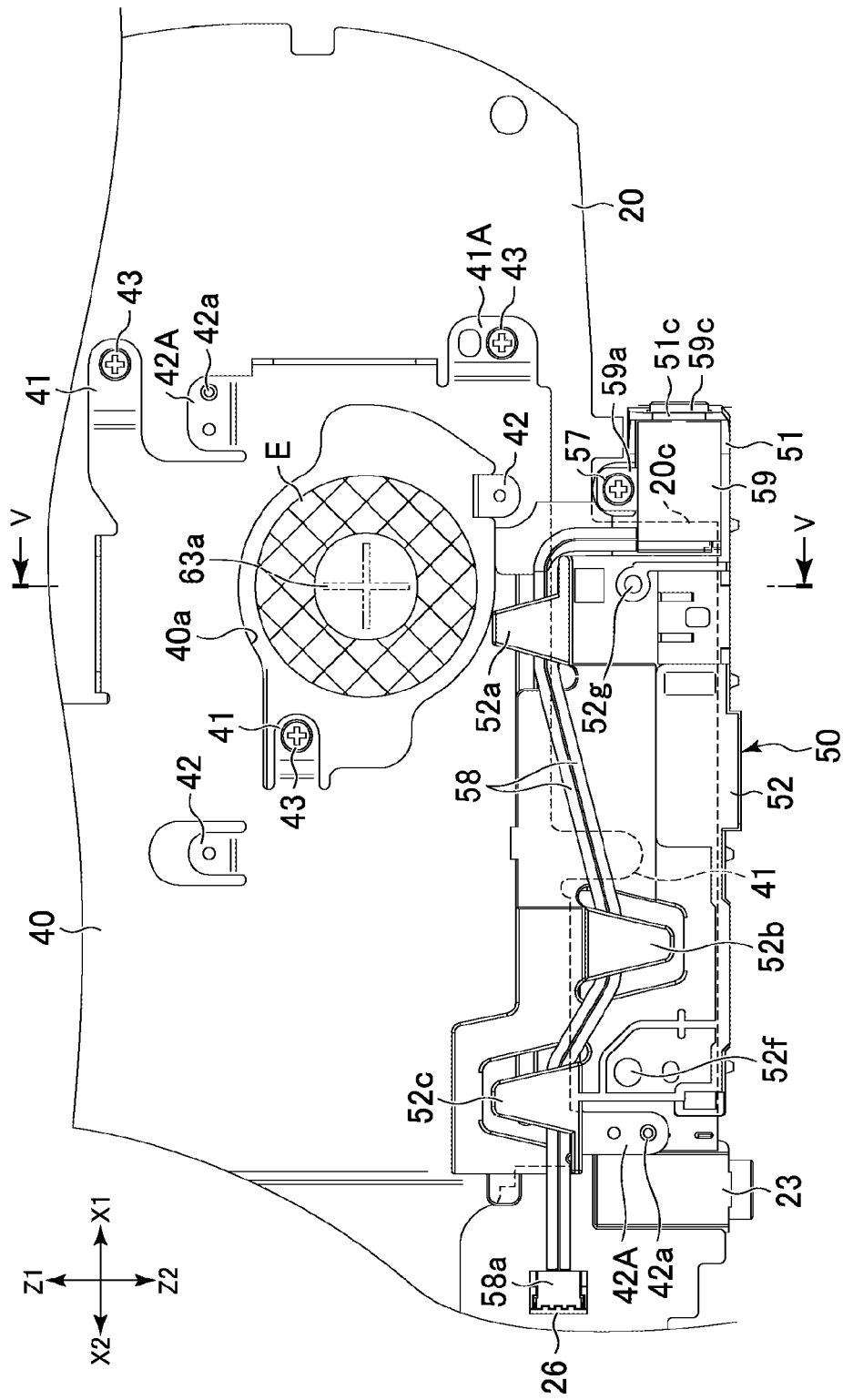
FIG. 4 is a rear view of a circuit board (a main board) and an intermediate frame.
Figure 5:
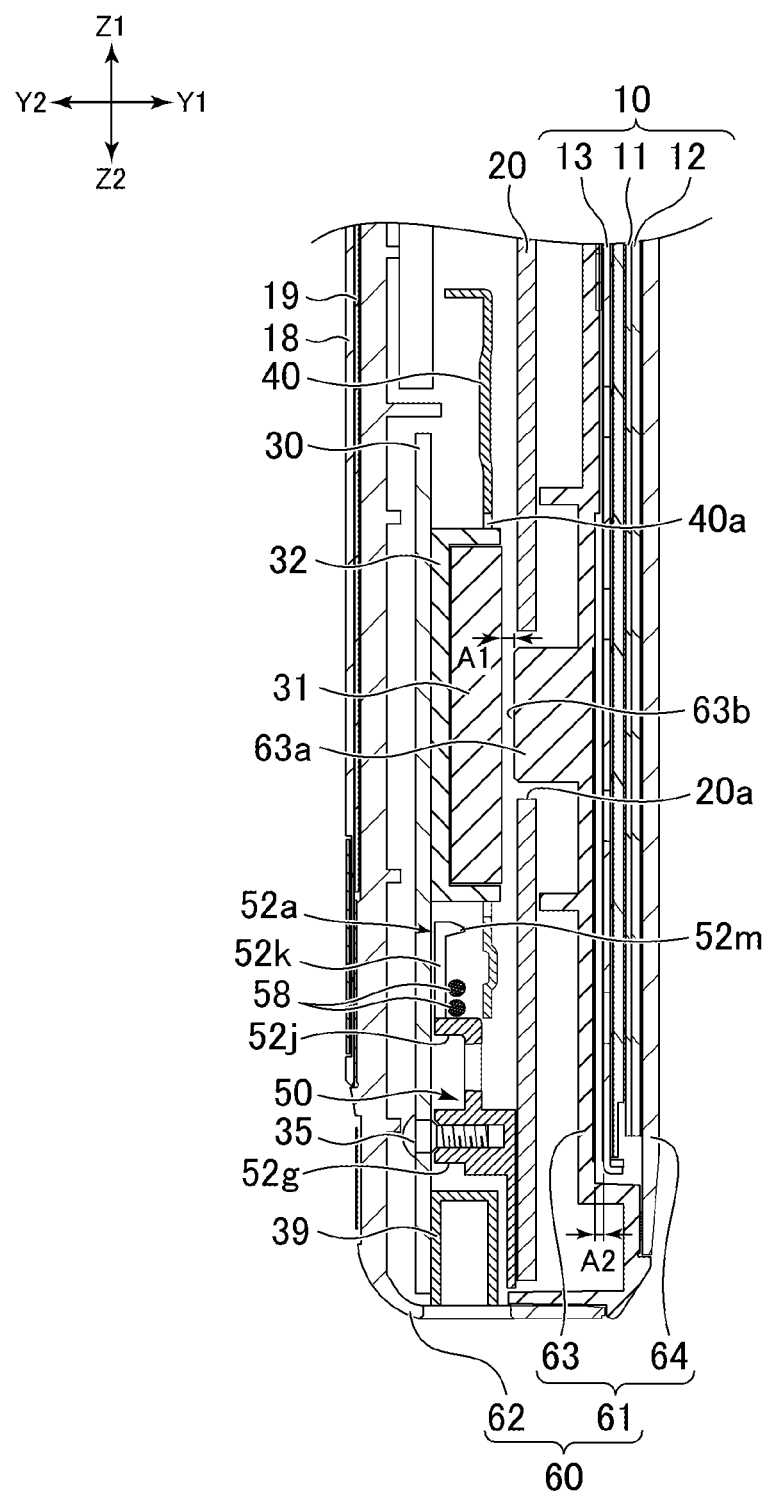
FIG. 5 is a sectional view of the electronic apparatus taken along line V-V shown in FIG. 4.

An embodiment of the present invention will be explained below with reference to the drawings. FIG. 1 is a front view of an electronic apparatus 1 according to the embodiment. FIG. 2 is a perspective view of the electronic apparatus 1 showing the lower surface thereof. FIG. 3 is an exploded perspective view of the electronic apparatus 1. FIG. 4 is a rear view of a circuit board 20 and an intermediate frame 40 shown in FIG. 3. FIG. 5 is a sectional view of the electronic apparatus 1 taken along line V-V shown in FIG. 4. FIG. 6 is a front view of a circuit board 30.

In the following explanation, X1 and X2 shown in FIG. 1 respectively indicate the left direction and the right direction and Z1 and Z2 shown in FIG. 1 respectively indicate the upward direction and the downward direction. Y1 and Y2 shown in FIG. 2 respectively indicate the front direction and the rear direction.

The electronic apparatus 1 is a portable electronic apparatus functioning as, for example, a game apparatus and a moving image reproducing apparatus. The electronic apparatus 1 may be used for testing the operation of application software (e.g., a game program) for use in a portable game apparatus and a portable moving image reproducing apparatus, having functions and an external shape generally the same as those of the apparatuses.

As shown in FIG. 1, the electronic apparatus 1 includes a display screen S on the front surface thereof. Plural operation members 2, 3, 4, and 5 operable by a user are arranged on the right side and the left side of the display screen S. In this example, plural (four in this example) buttons 2 arranged crosswise and an operation stick 4 are arranged on the right side of the display screen S. A direction key 3 having cross shape and an operation stick 5 are arranged on the left side of the display screen S. The operation sticks 4 and 5 include shaft portions 4a and 5a (see FIG. 2) projecting from the front surface of the electronic apparatus 1. The operation sticks 4 and 5 can be, for example, tilted in the radial directions of the shaft portions 4a and 5a and rotated in the circumferential direction in the tilted state. The operation sticks 4 and 5 maybe slidable in the radial direction of the shaft portions 4a and 5a. The electronic apparatus 1 in this example includes buttons 6 and 7 respectively at the right end and the left end of the upper surface thereof. The buttons 6 and 7 can be pressed in the downward direction.

As shown in FIG. 3, the electronic apparatus 1 includes a circuit board (a first circuit board) 20 and a circuit board (a second circuit board) 30 arranged facing the circuit board 20 in the front rear direction (in the following explanation, the circuit boards 20 and 30 are respectively referred to as main board and sub-board). For example, a CPU (central processing unit) and a GPU (graphics processing unit) that carries out image processing are mounted on the main board 20. Electronic components 34 such as an integrated circuit, a battery 31 explained below, and a battery holder 32 are mounted on the sub-board 30 (see FIG. 6). The components on the sub-board 30 perform, for example, processing for detecting operation states of the CPU and the GPU on the main board 20.

As shown in FIG. 5, the electronic apparatus 1 includes a display panel unit 10 constituting the display screen S. The display panel unit 10, the main board 20, and the sub-board 30 are arranged in this order from the front side toward the rear side. As shown in FIG. 3, the electronic apparatus 1 in this example further includes a circuit board 9. The circuit board 9 is arranged next to the main board 20. The circuit board 9 and the main board 20 are arranged on generally the same plane.

As shown in FIG. 5, the display panel unit 10 includes a display panel 11 such as a liquid crystal display panel or an organic electroluminescence panel. The display panel unit 10 in this example includes a touch panel 12 stuck to the front surface of the display panel 11. A tabular metal frame 13 is arranged on the rear surface of the display panel 11. The display panel 11 and the touch panel 12 are attached to the metal frame 13. As explained below, the display panel unit 10 is stuck to the rear surface of a front panel 64 that forms the front surface of the electronic apparatus 1.

As shown in FIG. 5, the electronic apparatus 1 in this example includes a rear touch panel 19 on the rear surface thereof. The user can operate the rear touch panel 19 with a finger (e.g., the middle finger or the index finger) placed on the rear surface of the electronic apparatus 1 while holding the right side portion and the left side portion of the electronic apparatus 1, for example, operating the operation members 2, 3, 4, and 5.

The electronic apparatus 1 includes a housing 60 molded of resin (plastic) that houses the main board 20, the sub-board 30, and the circuit board 9 (see FIGS. 2 and 5). The housing 60 includes a front housing (a first housing portion) 61 and a back housing 62. The front housing 61 and the back housing 62 are combined in the front rear direction, i.e., the thickness direction of the boards 20, 30, and 9. The rear touch panel 19 is attached to the outer surface of the back housing 62 (see FIG. 5). A protection panel 18 is stuck to the surface of the rear touch panel 19.

As shown in FIG. 5, the front housing 61 covers the front side of the main board 20. The back housing 62 covers the rear side of the sub-board 30. The front housing 61 in this example includes a front housing body 63 and a front panel 64. The front housing body 63 is arranged on the opposite side of the sub-board 30 across the main board 20 to cover the front side of the main board 20. The front panel 64 is attached to the outer circumference of the front surface of the front housing body 63 to form the front surface of the electronic apparatus 1. The front housing body 63 and the back housing 62 are combined in the front rear direction. The boards 20, 30, and 9 are arranged inside the front housing body 63 and the back housing 62. The display panel unit 10 is arranged in a gap formed between the front housing body 63 and the front panel 64. The front panel 64 is formed of a material having optical transparency.

[Supporting Structure for the Sub-Board]

As shown in FIGS. 3 and 5, the front housing body 63 includes a supporting protrusion 63a projecting toward the sub-board 30. The main board 20 has a shape, a part of which is cut out. The supporting protrusion 63a projects toward the sub-board 30 through the cut-out part. The main board 20 in this example includes, in a portion corresponding to the supporting protrusion 63a, a through-hole 20a which defining the cut-out. The supporting protrusion 63a projects toward the sub-board 30 through the through-hole 20a. The top of the supporting protrusion 63a (a portion indicated by reference sign 63b in FIG. 5) is located beyond the rear surface of the main board 20, i.e., a surface of the main board 20 facing toward the sub-board 30.

With this structure, even when a load is applied to the sub-board 30 from the rear side toward the front side, for example, even when the rear touch panel 19 is pushed hard, it is possible to support the sub-board 30 using the supporting protrusion 63a. With the structure in which the through-hole 20a is formed in the main board 20, compared with structure in which a cutout (a recess) is formed at an edge of the main board 20 and the supporting protrusion 63a passes through the cutout, it is possible to increase a degree of freedom of a position where the supporting protrusion 63a supports the sub-board 30. The through-hole 20a in this example is circular. Therefore, even when stress occurs in the main board 20, it is possible to prevent the stress from unequally acting around the through-hole 20a.

The supporting protrusion 63a is formed integrally with the front housing body 63. Therefore, it is possible to suppress an increase in the number of components. Since the supporting protrusion 63a is formed of resin (plastic), it is possible to prevent a portion with which the supporting protrusion 63a comes into contact, in this example, the surface of the battery 31 from being scratched.

As shown in FIG. 6, the sub-board 30 in this example includes plural components (31, 32, and 34) on the front surface of the sub-board 30, i.e., a surface of the sub-board 30 facing the main board 20. The supporting protrusion 63a projects toward a component having the largest thickness among the plural components (the thickness of the component is width in the thickness direction of the sub-board 30). In this example, the plural electronic components 34, the battery 31, and the battery holder 32 that holds the battery 31 are attached to the sub-board 30. The battery 31 and the battery holder 32 as a whole have thickness larger than the thickness of the electronic components 34. As shown in FIG. 5, the supporting protrusion 63a projects towards the battery 31. With this structure, it is possible to support the sub-board 30 using the supporting protrusion 63a having a small projection. As explained above, the top of the supporting protrusion 63a is located toward the sub-board 30 slightly beyond the rear surface of the main board 20, i.e., the surface of the main board 20 facing toward the sub-board 30. Therefore, it is possible to prevent the battery 31 and the battery holder 32 from coming into contact with the main board 20.

As shown in FIG. 5, a clearance Al is provided between the battery 31 and the supporting protrusion 63a. With this structure, it is possible to prevent a load from being applied to the sub-board 30 through the supporting protrusion 63a at the normal time, i.e., at a time when a load is not applied to the rear surface of the sub-board 30. The clearance Al is smaller than the thickness of the battery 31. Therefore, it is possible to prevent, using the supporting protrusion 63a, the battery 31 from completely coming off the batter holder 32. In this example, since the clearance Al is provided, when the sub-board 30 is pushed from the rear side, the supporting protrusion 63a comes into contact with the battery 31 and supports the sub-board 30 through the battery 31.

The battery 31 in this example is a flat circular battery (a button-type battery). As shown in FIGS. 5 and 6, the battery holder 32 is attached to the surface of the sub-board 30 by solder or the like. The battery 31 is fit in the battery holder 32 and attachable to, and detachable from, the battery holder 32. With the structure including the supporting protrusion 63a, it is possible to prevent the battery 31 from coming off the battery holder 32 by mistake.

As shown in FIG. 4, the surface of the main board 20 includes, around the through-hole 20a, a region where an electronic wiring pattern is not formed (hereinafter, no-pattern region) E (in FIG. 4, the no-pattern region E is hatched). The no-pattern region E has a shape corresponding to the shape of the battery 31. The battery 31 in this example is circular. The no-pattern region E is substantially annular. With this structure, it is possible to surely prevent a load from being applied to the electronic wiring pattern of the main board 20 from the battery 31.

As shown in FIGS. 3 and 4, the supporting protrusion 63a in this example has across shape. Therefore, it is possible to reduce the volume of the supporting protrusion 63a while securing a size of the region supported by the supporting protrusion 63a. For example, compared with the supporting protrusion 63a formed in a columnar shape, it is possible to reduce the volume of the supporting protrusion 63a. As a result, it is possible to realize a reduction in the weight of the front housing body 63. The shape of the supporting protrusion 63a may be an annular shape or an asterisk shape in plan view. Further, the supporting protrusion 63a maybe columnar.

As shown in FIGS. 4 and 5, the supporting protrusion 63a is not in contact with the inner circumferential edge of the through-hole 20a. In other words, a clearance is provided between the supporting protrusion 63a and the inner circumferential edge of the through-hole 20a. As explained below, the front housing body 63 includes projections 63c (see FIG. 3) for determining relative positions of the front housing body 63 and the main board 20. With the structure in which the clearance is formed between the supporting protrusion 63a and the inner circumferential edge of the through-hole 20a, it is possible to prevent the supporting protrusion 63a from obstructing the determining position of the main board 20 by the projections 63c.

An end face 63b of the supporting protrusion 63a, i.e., a surface of the supporting protrusion 63a facing toward the battery 31 is parallel to the battery 31 as shown in FIG. 5. With this structure, it is possible to stably support the battery 31 using the supporting protrusion 63a. The center of the supporting protrusion 63a coincides with the center of the battery 31. The supporting protrusion 63a in this example has a cross shape as explained above. The center of the cross coincides with the center of the battery 31. With this structure, it is possible to surely support the battery 31.

As explained above, the display panel unit 10 is arranged between the front housing body 63 and the front panel 64. As shown in FIG. 5, the display panel unit 10 is stuck to the rear surface of the front panel 64. A clearance A2 is provided between the display panel unit 10 and the front housing body 63. Therefore, even when a strong load acts on the front surface of the front panel 64, for example, even when the user pushes the front panel 64 hard in operating the touch panel 12, the load can be prevented from being transmitted to the battery 31 and the sub-board 30 through the supporting protrusion 63a.

The components on the sub-board 30 such as the battery 31 and the electronic components 34 are attached to the front surface of the sub-board 30, i.e., a surface of the sub-board 30 facing toward the rear touch panel 19. Therefore, even when the rear touch panel 19 is pushed hard, a load can be prevented from being applied to the components on the sub-board 30 through the back housing 62.

As shown in FIG. 3, a tabular intermediate frame 40 is arranged between the main board 20 and the sub-board 30. The intermediate frame 40 is attached to each of the main board 20 and the sub-board 30. With such a structure, it is easy to assemble the electronic apparatus 1 compared with structure in which the main board 20 is attached to the front housing body 63 and the sub-board 30 is supported by the back housing 62. In this example, the intermediate frame 40 includes plural attaching portions 41 and 41A projecting toward the surface of the main board 20. The attaching portions 41 and 41A are fixed to the front housing body 63 by screws 43 (see FIG. 4) together with the main board 20. The intermediate frame 40 includes plural attaching portions 42 and 42A projecting toward the surface of the sub-board 30. The sub-board 30 is attached to the attaching portions 42 and 42A by screws 33.

As shown in FIG. 4, the plural attaching portions 41 and 41A as a whole are arranged surrounding the through-hole 20a of the main board 20. In this example, the through-hole 20a is located in a region surrounded by three attaching portions 41 and one attaching portion 41A. Therefore, a decrease in rigidity of the main board 20 due to the formation of the through-hole 20a can be supplemented by the intermediate frame 40.

The intermediate frame 40 includes a hole 40a in a position corresponding to the battery 31 and the battery holder 32 (see FIG. 3). As shown in FIG. 5, the battery holder 32 is located inside the hole 40a. In other words, the surfaces of the battery holder 32 and the battery 31 are located closer to the main board 20 beyond the intermediate frame 40. With this structure, it is possible to reduce the distance between the main board 20 and the sub-board 30 while arranging the intermediate frame 40 between the main board 20 and the sub-board 30.

The intermediate frame 40 is a plate material made of metal. Therefore, the intermediate frame 40 can function as a heat sink for radiating heat of the main board 20 and the sub-board 30. The intermediate frame 40 is connected to a ground pattern formed on the surface of the main board 20 and a ground pattern formed on the surface of the sub-board 30 respectively via the attaching portions 41 and 41A and the attaching portions 42 and 42A. Consequently, it is possible to stabilize ground potential of the main board 20 and the sub-board 30.

As shown in FIG. 3, plural (two in this example) projections 63c projecting toward the main board 20 are formed in the front housing body 63. The projections 63c fit in holes formed in the main board 20. The position of the main board 20 relative to the front housing body 63 is determined by the projections 63c. With this structure, it is possible to highly accurately determine the position of the supporting protrusion 63a with respect to the through-hole 20a formed in the main board 20.

Holes in which the projections 63c fit are formed in the plural (two in this example) attaching portions 41A of the intermediate frame 40. Therefore, the position of the intermediate frame 40 relative to the front housing body 63 is determined by the projections 63c. Further, the plural attaching portions 42A of the intermediate frame 40 include projections 42a (see FIG. 4) projecting toward the sub-board 30. Holes in which the projections 42a fit are formed in the sub-board 30. The position of the sub-board 30 is determined by the intermediate frame 40. With this structure, it is possible to highly accurately regulate the positions of the battery 31 and the battery holder 32 relative to the hole 40a.

[Holding Structure for Connectors]

The electronic apparatus 1 includes plural electronic components exposed to the outside through openings formed in the housing 60. As shown in FIGS. 2 and 3, the electronic apparatus 1 in this example includes connectors 23, 24, 25, 39, and 59 as the plural electronic components. The connector 23 is, for example, a headphone jack. The connectors 24, 25, and 39 are connectors such as a USB connector or an HDMI connector for transmitting and receiving data between the electronic apparatus 1 and other electronic apparatuses. The connector 59 is, for example, a power supply connector for supplying electric power to the electronic apparatus 1. The connector 59 in this example is a substantially rectangular parallelepiped connector. The connector 59 has thickness (i.e., width in the thickness direction of the boards 20 and 30) larger than the thicknesses of the connectors 23, 24, 25, and 39.

As shown in FIGS. 2 and 3, the connectors 23, 24, and 25 are mounted at the lower edge of the main board 20. The connector 39 is mounted at the lower edge of the sub-board 30. The connectors 23, 24, 25, and 39 are exposed in a direction parallel to the boards 20 and 30, in this example, in the downward direction, through openings formed on the lower surface of the hosing 60. In this example, the connectors 24, 25, and 39 are exposed through openings formed in the back housing 62. The connector 23 is exposed through an opening formed between an edge of the back housing 62 and an edge of the front housing body 63.

The connector 59 is also exposed in the direction parallel to the boards 20 and 30 from the housing 60. Unlike the other connectors 23, 24, 25, and 39, the connector 59 is exposed in the left direction from a lower part of the housing 60. With this layout of the connector 59, it is possible to prevent a cable from coming off the connector 59 when the user moves the electronic apparatus 1 up and down during operation of the electronic apparatus 1. In this example, the connector 59 is exposed from an opening formed in the back housing 62. The connector 59 maybe exposed in the right direction.

Figure 7A:
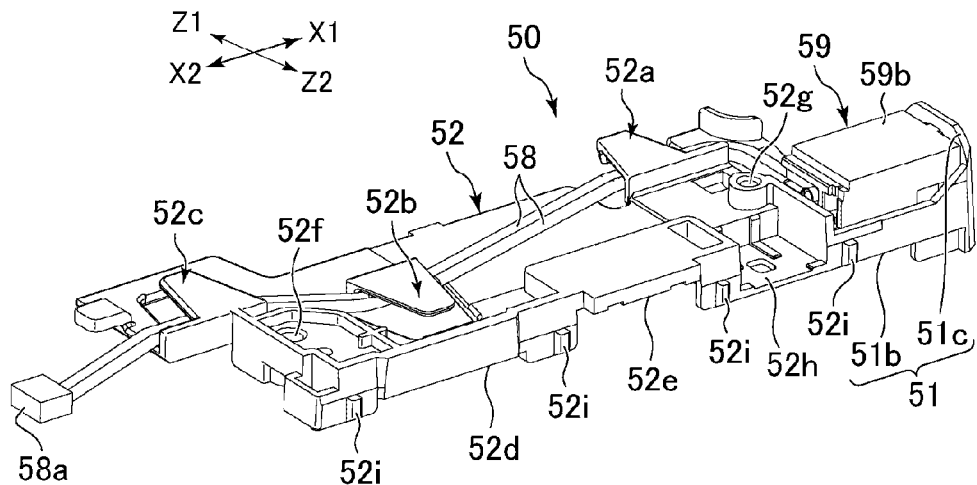
FIGS. 7A and 7B are perspective views of a holder.
Figure 7B:
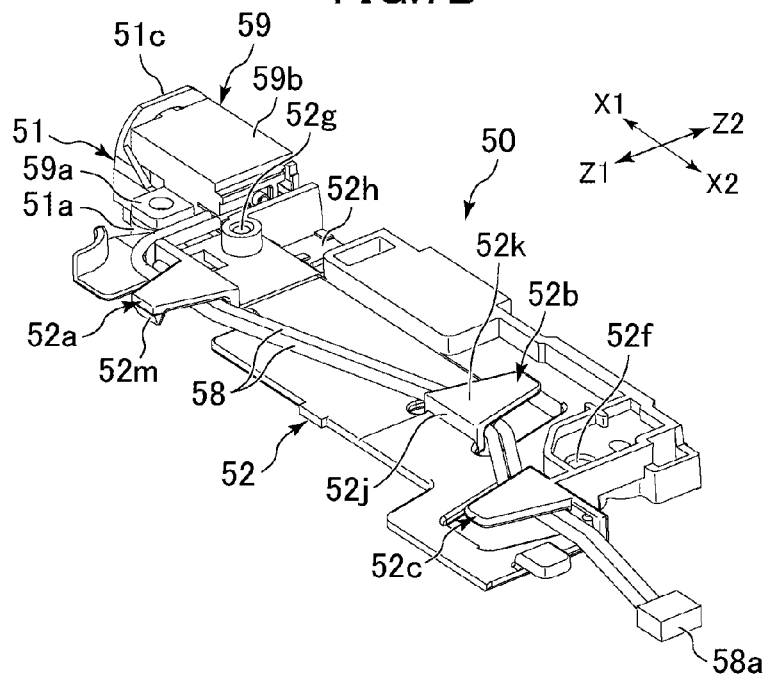
Figure 8:
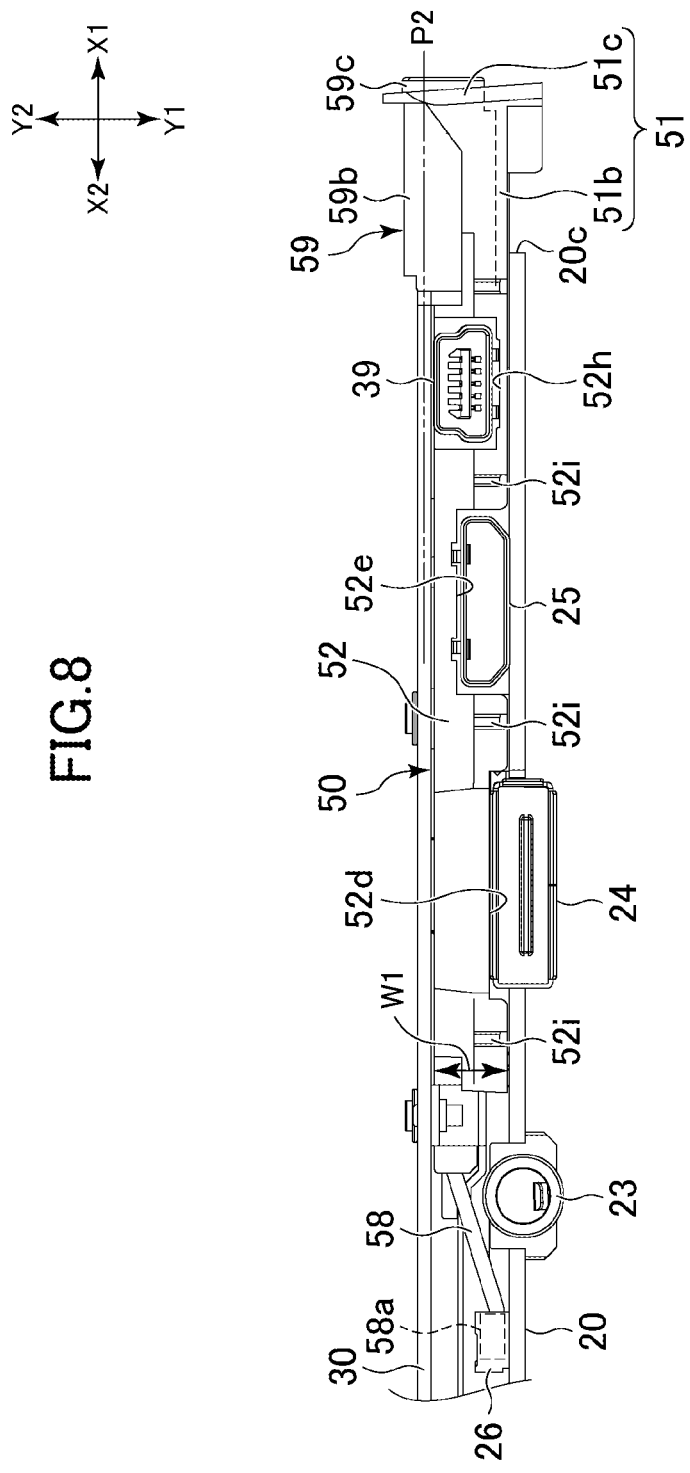
FIG. 8 is a diagram of the two circuit boards and the holder viewed on the lower side of the electronic apparatus.
Figure 9:
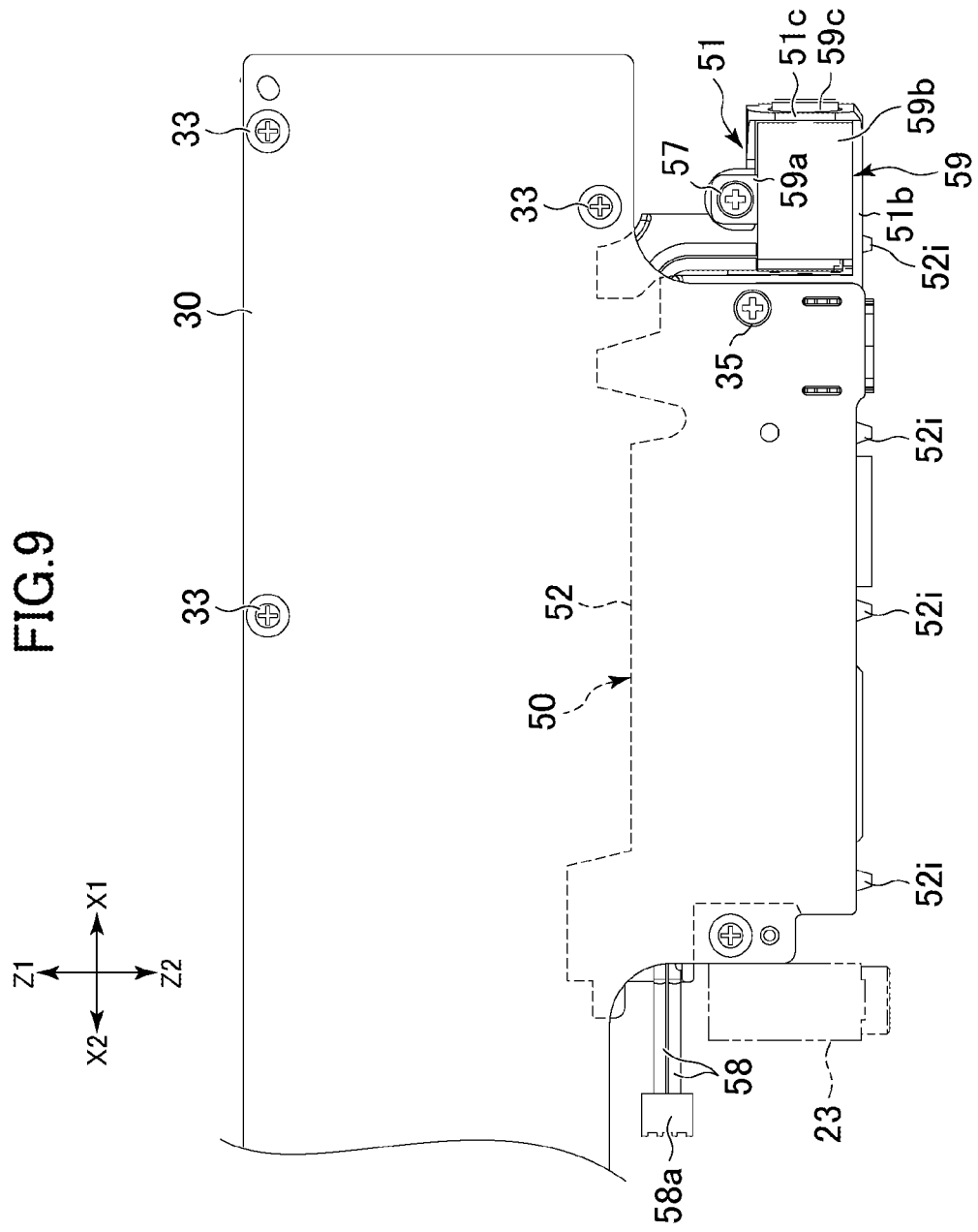
FIG. 9 is a rear view of the circuit board (the sub-board), wherein the position of a connector with respect to the sub-board is shown.

As shown in FIG. 3, the electronic apparatus 1 includes a holder 50. FIGS. 7A and 7B are perspective views of the holder 50. FIG. 8 is a diagram of the main board 20, the sub-board 30, and the holder 50 viewed on the lower side of the electronic apparatus 1. FIG. 9 is a rear view of the sub-board 30. The position of the connector 59 relative to the sub-board 30 is shown in FIG. 9.

As shown in FIG. 3 and FIGS. 7A and 7B, a cable 58 extending in a direction along the main board 20 and the sub-board 30, in this example, the right direction, is connected to the connector 59 (as explained above, the direction indicated by X2 is the right direction). The holder 50 includes a connector holder portion 51 that holds the connector 59 and a cable holder portion 52 that holds the cable 58. The connector holder portion 51 and the cable holder portion 52 are integrally molded of resin (specifically, plastic).

As shown in FIG. 8, the cable holder portion 52 is arranged on the front surface (a surface on the main board 20 side) of the sub-board 30. As explained below in detail, the cable holder portion 52 is attached to the sub-board 30. The connector holder portion 51 holds the connector 59 in a position offset (deviated) in the thickness direction of the sub-board 30 from a position on the front surface of the sub-board 30 (the position on the front surface of the sub-board 30 is the position of the connector 59 assumed to be arranged on the front surface of the sub-board 30). With this structure, it is possible to set the position of the connector 59 in the thickness direction of the sub-board 30 in an appropriate position without depending on the position of the sub-board 30 in the electronic apparatus 1. In this example, the connector 59 is positioned traversing a plane P2 defined by the sub-board 30 in the thickness direction of the sub-board 30 (the plane P2 is a plane in which the sub-board 30 is provided). In other words, apart (in FIG. 8, the top part) of the connector 59 is located on the opposite side of the holder 50 across the plane P2. With this layout of the connector 59, it is possible to realize a reduction in the width of the electronic apparatus 1 in the thickness direction of the sub-board 30 compared with structure in which the connector 59 is arranged on the front surface of the sub-board 30, i.e., the surface of the sub-board 30 on which the cable holder portion 52 is arranged. In an apparatus including two circuit boards such as the electronic apparatus 1, it is possible to reduce a space between the two boards by arranging the connector 59 in this way. In this example, as explained above, the connector 59 has thickness larger than the thicknesses of the other connectors 23, 24, 25, and 39. The connector 59 having the largest thickness is held by the holder 50. The other connectors 23, 24, 25, and 39 are mounted on the boards 20 and 30.

As shown in FIG. 9, the connector 59 is located on the outer side of an outer edge of the sub-board 30. Specifically, the connector 59 is located farther in the left direction than the edge on the left side of the sub-board 30 (as explained above, in this explanation, the direction indicated by X1 is the left direction). More specifically, the entire connector 59 is located farther in the left direction than the edge on the left side of the sub-board 30. Consequently, the layout in which the connector 59 is positioned traversing the plane P2 defined by the sub-board 30 is realized. As shown in FIG. 3, a cutout 30a is formed at an edge of the sub-board 30. The connector 59 is arranged inside the cutout 30a. With this structure, it is possible to reduce the size of the electronic apparatus 1 in front view compared with structure in which the connector 59 is arranged on the outer side of the outer edge of the sub-board 30 without forming the cutout 30a.

As shown in FIG. 8, thickness W1 of the cable holder portion 52 is smaller than the entire thickness of the connector 59 and the connector holder portion 51. The cable holder portion 52 is located between the main board 20 and the sub-board 30. The connector 59 and the connector holder portion 51 are located on the outer side of the edge of the sub-board 30. In other words, a thin portion is arranged between the main board 20 and the sub-board 30 and a thick portion is arranged on the outer side of the edge of the sub-board 30.

As shown in FIG. 8, the cable holder portion 52 is located on the rear surface (the surface facing toward the sub-board 30) of the main board 20. The connector holder portion 51 holds the connector 59 in a position offset (deviated) in the thickness direction of the main board 20 from a position on the rear surface of the main board 20 (the position on the rear surface of the main board 20 is the position of the connector 59 assumed to be arranged on the rear surface of the main board 20). With this structure, it is possible to set the position of the connector 59 in the thickness direction of the main board 20 in an appropriate position without depending on the position of the main board 20 in the electronic apparatus 1. In this example, the connector 59 is located away from the rear surface of the main board 20 in the thickness direction of the main board 20. With this structure, it is easy to prevent interference between the cable 58 of the connector 59 and the components (e.g., the connectors 24 and 25) on the rear surface of the main board 20 to which the cable 58 is connected.

As shown in FIG. 4, the connector holder portion 51 and the connector 59 have portions located on the outer side of an edge of the main board 20. In this example, most portions of the connector holder portion 51 and the connector 59 are located extending beyond an edge 20c on the left side of the main board 20 in the left direction (as explained above, the direction indicated by X1 is the left direction). The connector holder portion 51 and the connector 59 are attached to the front housing body 63 and are not attached to the main board 20. Specifically, as shown in FIG. 7B, the connector holder portion 51 and the connector 59 include attaching portions 51a and 59a in the portions located beyond the edge 20c. The attaching portions 51a and 59a are attached to a boss 63d (see FIG. 3), which is formed in the front housing body 63, by a screw 57 (see FIG. 4). The screw 57 is not inserted through the main board 20. With this structure, it is possible to prevent a load from being applied to the main board 20 through the connector 59 when a cable is connected to the connector 59 from the outside.

A cutout 20b is formed at an edge of the main board 20 in this example (see FIG. 3). The connector holder portion 51 and the connector 59 are located in a region surrounded by edges of the cutout 20b. With this structure, it is possible to reduce the size of the electronic apparatus 1 in front view compared with structure in which the connector 59 is arranged on the outer side of the edge of the main board 20 without forming the cutout 20b.

As shown in FIGS. 7A and 7B and FIG. 8, the connector 59 includes a substantially rectangular parallelepiped main body 59b and an end 59c projecting from the main body 59b. A cable is inserted into the connector 59 through the end 59c. As shown in FIG. 7A, the connector holder portion 51 includes a base 51b having the bottom on which the main body 59b of the connector 59 is placed. The connector holder portion 51 includes an end holder portion 51c. The end holder portion 51c has a hole formed thereon in which the end 59c fits. By providing the end holder portion 51c in the connector holder portion 51, it is possible to prevent the connector 59 from shaking when the cable is inserted into the connector 59.

The cable 58 extends in the direction along the main board 20 and the sub-board 30, i.e., the right direction from the connector 59. As explained above, the cable 58 is held by the cable holder portion 52. Consequently, it is possible to prevent interference between the connectors 23, 24, 25, and 39 and the cable 58.

As shown in FIGS. 7A and 7B, the cable holder portion 52 has an elongated shape in an extending direction of the cable 58 (in this example, the left and right direction). The cable holder portion 52 includes plural (three in this example) engaging portions 52a, 52b, and 52c arranged side by side in the extending direction of the cable 58. The cable 58 is engaged with the engaging portions 52a, 52b, and 52c. As shown in FIG. 5, the engaging portion 52a is formed in an arm having a L shape in cross section. Specifically, the engaging portion 52a includes a base portion 52j standing in the thickness direction of the boards 20 and 30 and an arm portion 52k extending in the direction along the boards 20 and 30 from the base portion 52j. Like the engaging portion 52a, the engaging portions 52b and 52c include base portions 52j and arm portions 52k. The cable 58 is arranged along the cable holder portion 52. The arm portions 52k of the three engaging portions 52a, 52b, and 52c cover the cable 58 to prevent the cable 58 from separating from the cable holder portion 52. A hook 52m for preventing the cable 58 from coming off the engaging portion 52a is formed at an end of the engaging portion 52a (see FIG. 7B).

As shown in FIGS. 7A and 7B, the engaging portions 52a, 52b, and 52c are arranged such that the cable 58 bends in plural positions thereof. In other words, the positions of the engaging portions 52a, 52b, and 52c are offset (deviated) from one another in a direction orthogonal to the extending direction of the cable 58. Specifically, the positions of the base portions 52j of the engaging portions 52a, 52b, and 52c are offset from one another in the direction orthogonal to the extending direction of the cable 58. In this example, the base portion 52j of the engaging portion 52b located in the center among the three engaging portions 52a, 52b, and 52c is offset downward relatively to the base portions 52j of the other two engaging portions 52a and 52c (as explained above, the direction indicated by Z2 is the downward direction). The arm portions 52k of the two engaging portions (e.g., 52a and 52b) adjacent to each other extend to opposite sides (outer side) each other. Specifically, the engaging portion 52b located to be shifted downward includes the arm portion 52k extending downward. The engaging portions 52a and 52c located to be shifted upward include the arms 52k extending upward. The adjacent two engaging portions open in opposite directions each other. With such a shape and arrangement of the engaging portions 52a, 52b, and 52c, it is possible to effectively prevent the cable 58 from coming off the cable holder portion 52.

As shown in FIGS. 7A and 7B, a connector 58a is provided at an end of the cable 58. The connector 58a is attached to the connector 26 (see FIG. 3) mounted on the main board 20. The length of the cable 58 is set shorter than length at which the cable 58 can be disengaged from the engaging portions 52a, 52b, and 52c. In other words, the length is set to prevent the cable 58 from sagging in the state in which the connector 58a is attached to the connector 26.

The cable holder portion 52 is fixed to the main board 20. As explained above, the cable holder portion 52 is arranged on the main board 20. As shown in FIGS. 7A and 7B, an attachment hole 52f into which a screw (not shown in the figures) is inserted is formed in the cable holder portion 52. The screw is attached to a boss 63f of the front housing body 63 through a hole formed in the main board 20 (see FIG. 3). Consequently, the cable holder portion 52 is fixed to the main board 20. As a result, the cable holder portion 52 can push the connectors 24 and 25 toward the main board 20. With this structure, it is possible to improve a stability in attaching the connectors 24 and 25 to the main board 20. As shown in FIGS. 7A and 8, the cable holder portion 52 in this example includes, in positions corresponding to the connectors 24 and 25, recesses 52d and 52e having width corresponding to those of the connectors 24 and 25 (the width is a width in the left-right direction). The connectors 24 and 25 are fit in the recesses 52d and 52e. Therefore, it is possible to regulate the movement in the left right direction of the connectors 24 and 25 using the cable holder portion 52.

The cable holder portion 52 is fixed to the sub-board 30 as well. In this example, an attachment hole into which a screw 35 (see FIG. 9) is inserted is formed in the sub-board 30. An attachment hole 52g through which the screw 35 is fixed is formed in the cable holder portion 52 (see FIGS. 7A and 7B). The sub-board 30 and the cable holder portion 52 are fixed to each other by the screw 35. As a result, the cable holder portion 52 can push the connector 39 mounted on the sub-board 30 toward the sub-board 30. With this structure, it is possible to improve a stability in attaching the connector 39 to the sub-board 30. As shown in FIGS. 7A and 8, the cable holder portion 52 in this example includes a recess 52h having width corresponding to the width of the connector 39. The connector 39 is fit in the recess 52h. Therefore, it is possible to regulate the movement in the left-right direction of the connector 39 using the cable holder portion 52.

As explained above, the tabular intermediate frame 40 is arranged between the main board 20 and the sub-board 30. The cable holder portion 52 partially overlaps the intermediate frame 40. In other words, as shown in FIG. 4, an upper portion of the cable holder portion 52 is located on the intermediate frame 40. By laying out the intermediate frame 40 and the cable holder portion 52 in this way, it is possible to increase the size of the intermediate frame 40. As a result, it is possible to improve heat radiation performance of the intermediate frame 40 and improve a function of stabilizing ground potential.

As shown in FIG. 3, the front housing body 63 includes, at the lower edge thereof, a lower wall portion 63g standing toward the back housing 62. The cable holder portion 52 is arranged on the inner side of the lower wall portion 63g. The lower wall portion 63g and the cable holder portion 52 are formed to be capable of engaging with each other. In this example, the cable holder portion 52 includes plural (four in this example) protrusions 52i projecting toward the lower wall portion 63g (see FIG. 7A). Holes 63e in which the protrusions 52i fit are formed in the lower wall portion 63g.

With this structure, it is possible to prevent the movement of the cable holder portion 52 relative to the front housing body 63. As a result, it is possible to more effectively prevent the movement of the connectors 24 and 25 relative to the main board 20 and the movement of the connector 39 relative to the sub-board 30. In this example, the plural protrusions 52i are located to be spaced apart from one another in a direction in which the connectors 24, 25, and 39 are arranged side by side (the left right direction in this example). Each of the connectors 24, 25, and 39 is located between two protrusions 52i adjacent to each other (see FIG. 8).

[Connection Structure for a Flat Cable]

As shown in FIG. 3, a flexible flat cable 70 is connected to the sub-board 30. The sub-board 30 is connected to the main board 20 through the flat cable 70.

Figure 10:
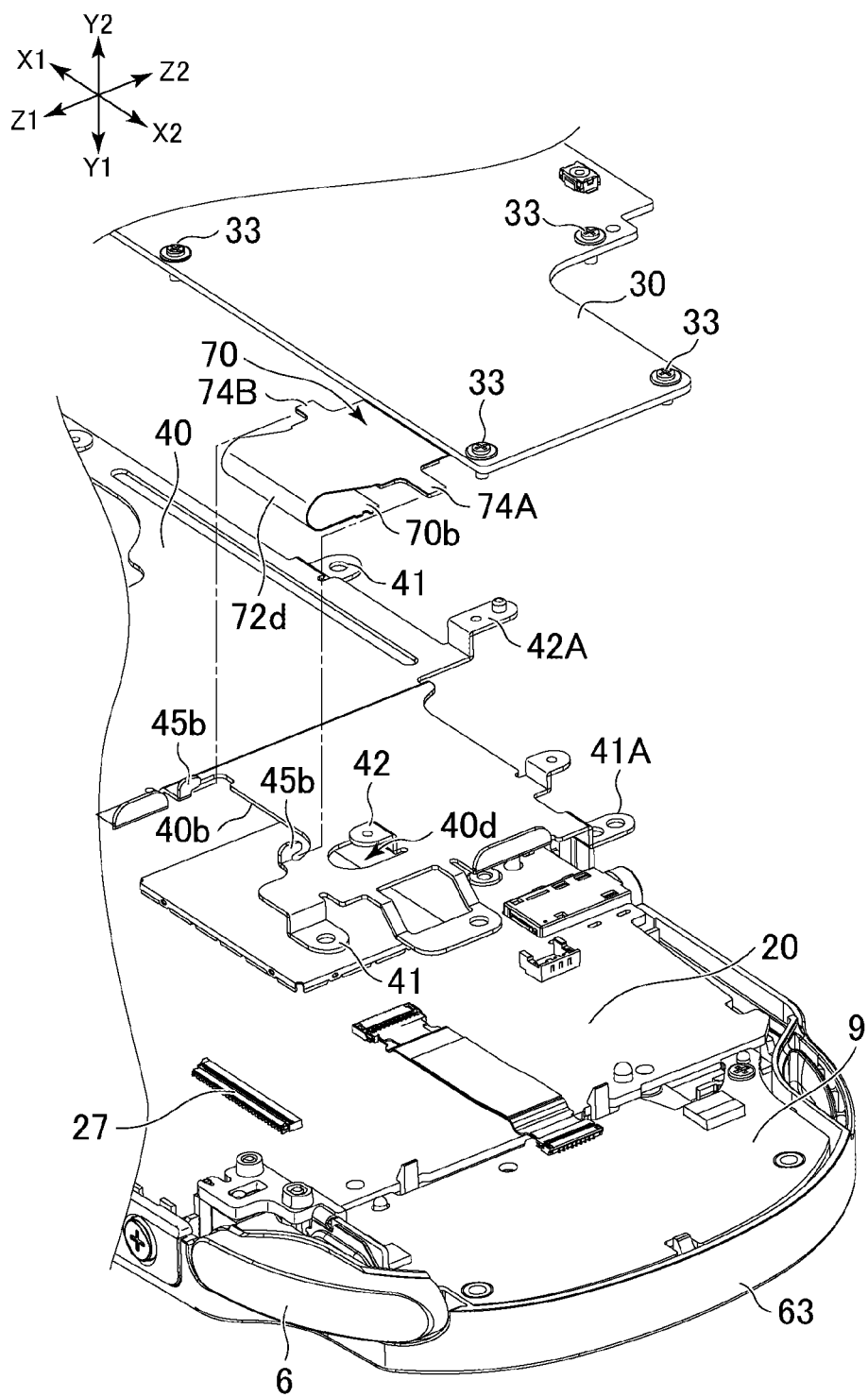
FIG. 10 is an exploded perspective view for explaining a connection structure for a flat cable.
Figure 11:
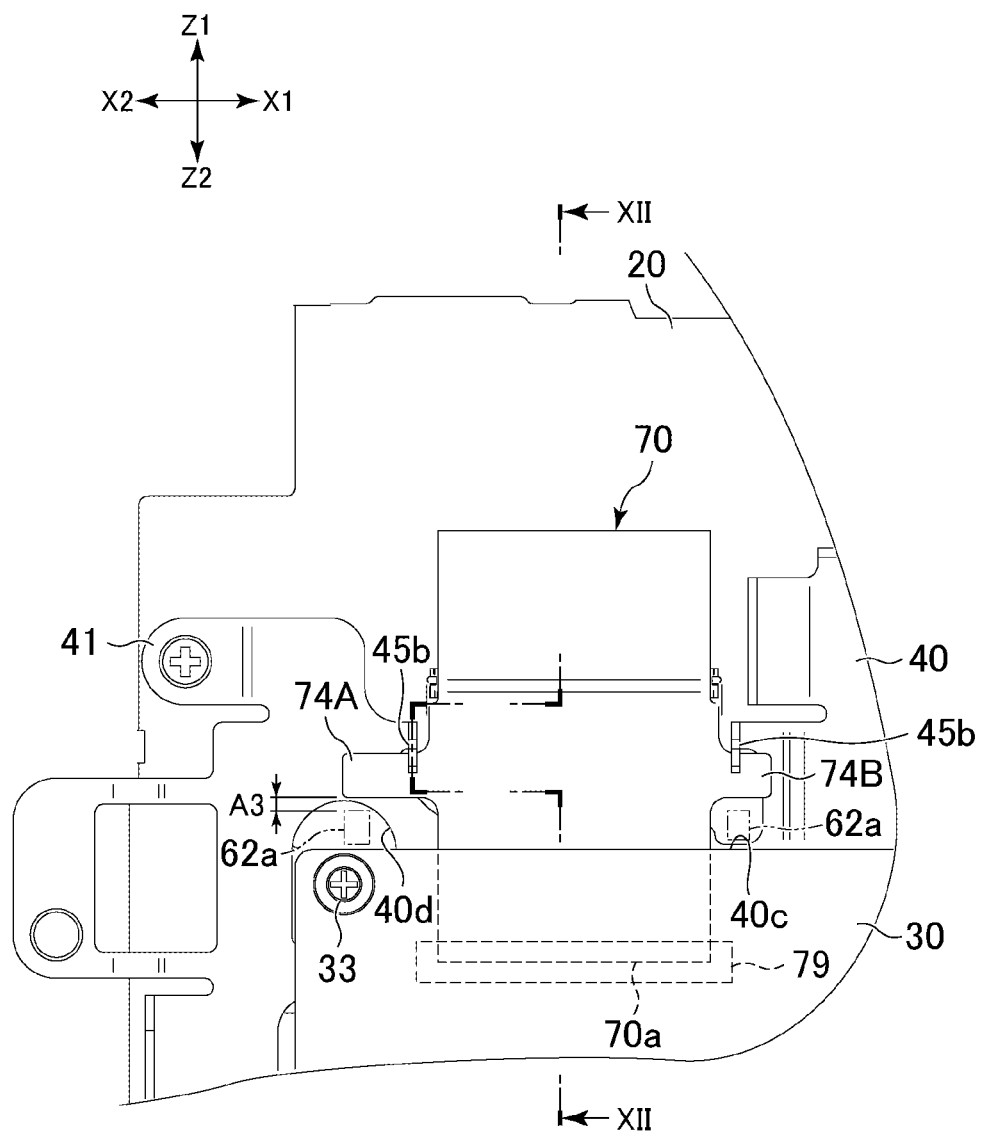
FIG. 11 is a rear view of the sub-board attached to an intermediate frame.
Figure 12:
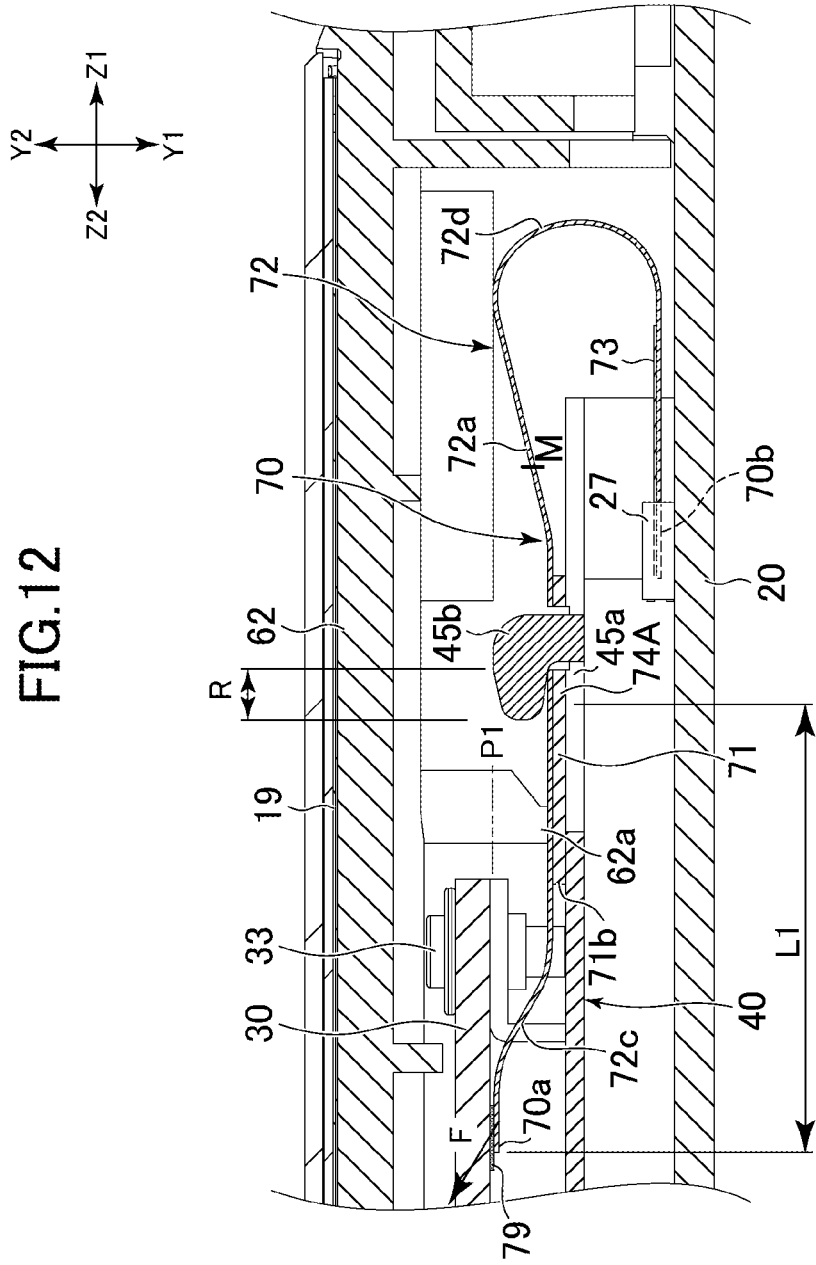
FIG. 12 is a sectional view taken along line XII-XII shown in FIGS. 11.
Figure 13:
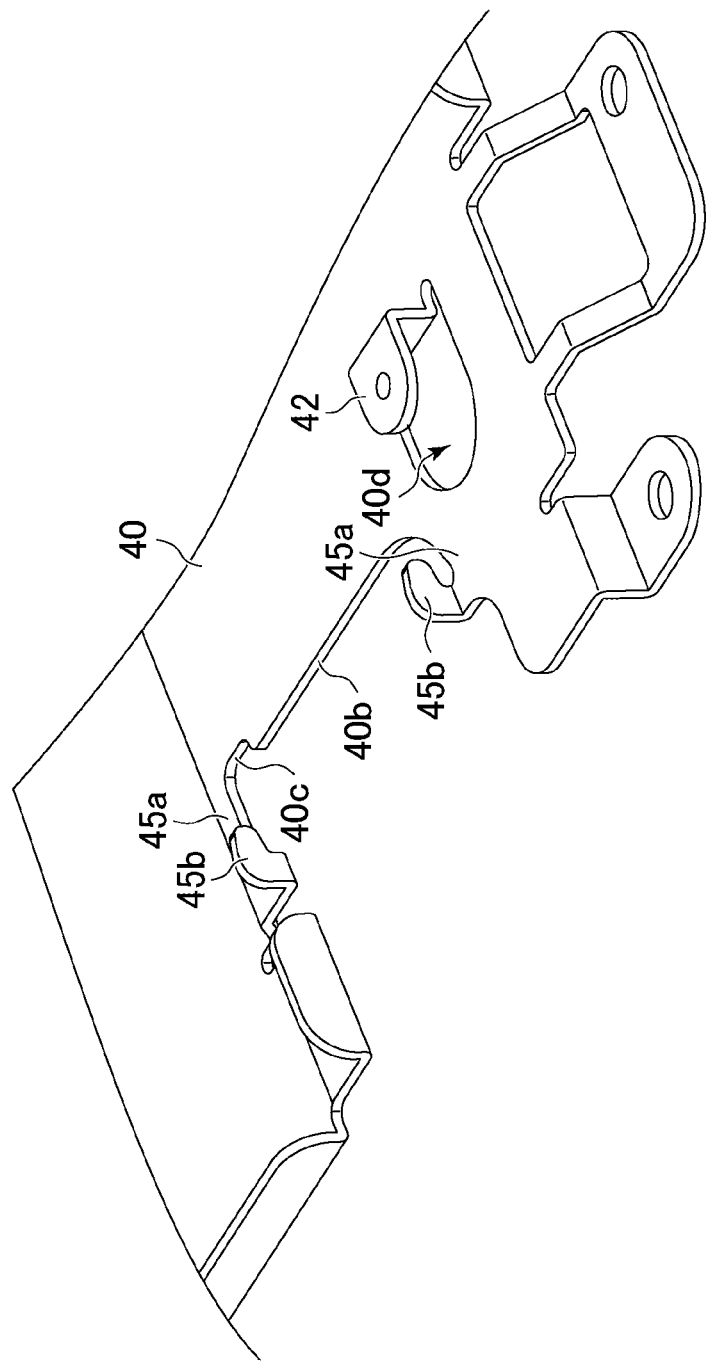
FIG. 13 is an enlarged perspective view of FIG. 10, wherein a main part of the intermediate frame is shown.

FIG. 10 is an exploded perspective view for explaining connection structure for the flat cable 70. FIG. 11 is a rearview of the sub-board 30 for explaining the connection structure for the flat cable 70. FIG. 12 is a sectional view taken along line XII-XII shown in FIG. 11. FIG. 13 is an enlarged perspective view of FIG. 10. A main part of the intermediate frame 40 is shown in FIG. 13.

As shown in FIGS. 6 and 12, one end 70a of the flat cable 70 is bonded to the surface of the sub-board 30 (the front surface of the sub-board 30 facing the main board 20) through an anisotropic conductive film 79 (in the following explanation, the anisotropic conducive film is described as ACF). The ACF 79 is, for example, a film made of a thermosetting adhesive. The end 70a of the flat cable 70 is attached to the surface of the sub-board 30 by heating and pressurizing. The ACF 79 includes conductive particles having conductivity only in a direction in which the end 70a of the flat cable 70 and the sub-board 30 face each other, i.e., the thickness direction of the ACF 79. Plural conductor lines of the flat cable 70 are respectively electrically connected to plural electrodes, which are formed on the surface of the sub-board 30, through the ACF 79.

As shown in FIG. 10, the flat cable 70 includes engaged portions 74A and 74B. The flat cable 70 in this example includes the engaged portions 74A and 74B respectively at edges along an extending direction of the flat cable 70, i.e., the right edge and the left edge of the flat cable 70. The engaged portions 74A and 74B in this example project in parallel to the sub-board 30. In other words, the engaged portions 74A and 74B respectively projects in the right direction and the left direction. The engaged portions 74A and 74B are located apart from the end 70a. In this example, the flat cable 70 includes a first reinforcing plate 71 (see FIG. 12) explained below in a position apart from the end 70a. The first reinforcing plate 71 forms the engaged portions 74A and 74B.

As shown in FIG. 12, the intermediate frame (an engaging member) 40 engages with the engaged portions 74A and 74B to restrain the movement of the engaged portions 74A and 74B in a direction away from the electrode of the sub-board 30. The intermediate frame 40 in this example includes first stopper portions 45a (see FIG. 13). The engaged portions 74A and 74B (i.e., portions of the first reinforcing plate 71 constituting the engaged portions 74A and 74B) and the first stopper portions 45a are spaced from a plane P1 defined by the surface of the sub-board 30. The first stopper portions 45a are in contact against the engaged portions 74A and 74B to restrain the movement of the engaged portions 74A and 74B in the direction away from the plane P1, i.e., the movement of the engaged portions 74A and 74B in the thickness direction of the sub-board 30. The intermediate frame 40 includes second stopper portions 45b projecting in the thickness direction of the sub-board 30 toward the flat cable 70. The second stopper portions 45b restrain the engaged portions 74A and 74B from moving away from the sub-board 30 in the direction parallel to the sub-board 30. With this function of the intermediate frame 40, it is possible to improve a stability in connecting the end 70a of the flat cable 70 to the sub-board 30.

A cable main body 72 formed of a flexible material includes a first inclined portion 72c extending from the end 70a in a direction oblique to both of the thickness direction of the sub-board 30 and the parallel direction to the sub-board 30. The engaged portions 74A and 74B are formed in a portion further extending from the first inclined portion 72c. The stopper portions 45a and 45b push the engaged portions 74A and 74B toward the electrode formed on the sub-board 30. Consequently, a force F for pushing the end 70a toward the surface of the sub-board 30 is generated and thus connection stability can be further improved.

Specifically, the end 70a and the portion having the engaged portions 74A and 74B formed thereon have a distance L1 therebetween in a direction parallel to the sub-board 30. The distance L1 is smaller than the length of the flat cable 70 between the end 70a and the portion having the engaged portions 74A and 74B formed thereon. In other words, the positions of the stopper portions 45a, 45b are determined such that the distance L1 is smaller than the length of the flat cable 70 between the end 70a and the portion having the engaged portions 74A and 74B formed thereon. Therefore, the flat cable 70 includes a sagging portion between the end 70a and the portion having the engaged portions 74A and 74B formed thereon. This structure generates, in the flat cable 70, a force which tends to stretch the portion between the end 70a and the portion having the engaged portions 74A and 74B formed thereon. The stopper portions 45a, 45b push, against the force, the engaged portions 74A and 74B toward the electrode of the sub-board 30. As described above, the engaged portions 74A and 74B and the first stopper portions 45a are spaced from the plane P1 in the thickness direction of the sub-board 30. Therefore, a vertical direction component of the force F, which obliquely pushes the end 70a toward the sub-board 30, presses the end 70a against the surface of the sub-board 30 in the thickness direction of the sub-board 30.

The intermediate frame 40 is formed of metal as explained above. Therefore, the rigidity of the stopper portions 45a and 45b can be secured, compared with structure in which the stopper portions 45a and 45b are formed of resin. As a result, it is possible to surely prevent the movement of the engaged portions 74A and 74B of the flat cable 70.

As shown in FIG. 13, the intermediate frame 40 includes the first stopper portions 45a in two positions respectively corresponding to the engaged portions 74A and 74B. The intermediate frame 40 includes two second stopper portions 45b. The two second stopper portions 45b are located respectively along the right edge and the left edge of the flat cable 70. The second stopper portions 45b in this example are formed in a hook shape. The engaged portions 74A and 74B are located inside the second stopper portions 45b. With such a shape of the second stopper portions 45b, in an assembly process for the electronic apparatus 1, work for engaging the engaged portions 74A and 74B with the second stopper portions 45b is easily performed.

As shown in FIG. 6, the engaged portions 74A and 74B are located further outwardly than the outer edge of the sub-board 30. In this example, the engaged portions 74A and 74B are located further upward than the upper edge of the sub-board 30. With such arrangement of the engaged portions 74A and 74B, it is possible to increase a degree of freedom of the shape of the second stopper portions 45b. In other words, it is easy to prevent interference between the second stopper portions 45b and the sub-board 30.

As shown in FIG. 12, the flat cable 70 includes the cable main body 72 on which the plural conductor lines are formed. The cable main body 72 is formed of a flexible material (e.g., polyimide). The flat cable 70 includes the first reinforcing plate 71 attached to the cable main body 72. The first reinforcing plate 71 is formed of a material (e.g., glass epoxy resin) having rigidity higher than the rigidity of the cable main body 72. The first reinforcing plate 71 constitutes the engaged portions 74A and 74B. With this structure, it is possible to prevent the engaged portions 74A and 74B from being deformed and damaged. The first reinforcing plate 71 is located apart from the end 70a of the flat cable 70. Therefore, a portion between the end 70a and the first reinforcing plate 71 can sag as shown in FIG. 12.

As shown in FIG. 12, the other end 70b of the flat cable 70 is connected to the main board 20. Specifically, a connector 27 is mounted on the surface of the main board 20, i.e., the rear surface of the main board 20 facing the sub-board 30. The end 70b is inserted into the connector 27. The flat cable 70 includes the engaged portions 74A and 74B in positions closer to the end 70a than an intermediate position M between the end 70b and the end 70a. Consequently, it is possible to determine a distance between the engaged portions 74A and 74B and the end 70a relatively small. As a result, it is possible to prevent an unintended sag from occurring in the flat cable 70 between the end 70a and the portion formed with the engaged portions 74A and 74B. It is possible to further improve the connection stability of the end 70a of the flat cable 70 to the sub-board 30.

In this example, as explained above, the main board 20 and the sub-board 30 are arranged facing each other. Therefore, the flat cable 70 is bent 180 degrees in a bent portion 72d halfway in the flat cable 70. The flat cable 70 includes the first reinforcing plate 71 between the bent portion 72d and the end 70a connected to the sub-board 30. With this structure, it is possible to prevent stress due to the bending of the bent portion 72d from acting on the end 70a.

As shown in FIG. 12, the cable main body 72 includes a second inclined portion 72a between the first reinforcing plate 71 and the bent portion 72d. The second inclined portion 72a is inclined in a direction away from the main board 20, i.e., toward the plane P1 defined by the surface of the sub-board 30. The bent portion 72d is gently bent due to the inclination of the second inclined portion 72a. The first reinforcing plate 71 is located between the first inclined portion 72c and the second inclined portion 72a and allocated away from the plane P1. In other words, the flat cable 70 extends from the end 70a in the direction away from the plane P1 and then approaches the plane P1 again toward the start portion of the bend of the bent portion 72d. With such a shape of the flat cable 70, it is possible to realize the gentle bend of the bent portion 72d and urging the end 70a to the sub-board 30.

As shown in FIG. 12, a second reinforcing plate 73 is provided at the end 70b of the flat cable 70. The first reinforcing plate 71 has rigidity higher than the rigidity of the second reinforcing plate 73. For example, the first reinforcing plate 71 is thicker than the second reinforcing plate 73. The first reinforcing plate 71 may be formed of a material which is different from the material of the second reinforcing plate 73 and has rigidity higher than the rigidity of the second reinforcing plate 73. Alternately, such a reinforcing plate is not provided at the end 70a bonded to the sub-board 30.

As explained above, the sub-board 30 is attached to the intermediate frame 40. Therefore, it is possible to prevent a deviation of relative positions of the stopper portions 45a and 45b with respect to the sub-board 30. As a result, it is possible to prevent an inappropriate load from occurring between the end 70a of the flat cable 70 and the ACF 79 because of the positional deviation of the stoppers 45a and 45b. The intermediate frame 40 in this example is a member used for coupling of the main board 20 and the sub-board 30. It is possible to prevent an increase in the number of components by restricting the movement of the engaged portions 74A and 74B using such a member.

As shown in FIG. 10, in this example, a recess 40b is formed at an edge of the intermediate frame 40. The first stopper portions 45a are portions including the left and right edges of the recess 40b. The second stopper portions 45b project from the left and right edges of the recess 40b. The second stopper portions 45b are located along an edge of the flat cable 70. The intermediate frame 40 in this example is a member formed by sheet metal working. The second stopper portions 45b are formed by bending a plate material toward the flat cable 70.

As shown in FIG. 12, the first reinforcing plate 71 is supported in parallel to the sub-board 30 by the intermediate frame 40. In this example, the end 71b of the first reinforcing plate 71 is located on an edge of the recess 40b of the intermediate frame 40. With this structure, it is possible to prevent a reduction in the force F due to the tilt of the first reinforcing plate 71 and surly prevent the movement of the end 71b of the first reinforcing plate 71 in the direction away from the sub-board 30.

As explained above, the second stopper portions 45b restrict the movement of the engaged portions 74A and 74B away from the electrode on the sub-board 30 in the direction parallel to the sub-board 30. As shown in FIGS. 11 and 12, the electronic apparatus 1 includes third stopper portions 62a that restrict the movement of the engaged portions 74A and 74B in a direction opposite to the direction of the movement away from the electrode. With this structure, it is possible to surely prevent the engaged portions 74A and 74B and the second stopper portions 45b from being disengaged by mistake. In this example, the third stopper portions 62a are formed in the back housing 62 that covers the rear surface of the sub-board 30, i.e., an opposite surface of the sub-board 30 from the surface on which the ACF 79 is provided. The third stopper portions 62a project toward the flat cable 70 from the back housing 62. The third stopper portions 62a are located toward the end 70a from the engaged portions 74A and 74B. In other words, the engaged portions 74A and 74B are located between the third stopper portion 62a and the second stopper portions 45b.

The third stopper portions 62a extend beyond the intermediate frame 40 in the thickness direction of the intermediate frame 40 toward the main board 20. As shown in FIGS. 11 and 13, the intermediate frame 40 in this example includes a hole 40d located from the one second stopper portion 45b toward the end 70a. The third stopper portion 62a is fit in the hole 40d to restrict the movement of the engaged portion 74A. The intermediate frame 40 includes, at the inner edge of the recess 40b, a recess 40c located from the second stopper portion 45b toward the end 70a. The third stopper portion 62a is fit in the inner side of the recess 40c to restrict the movement of the engaged portion 74B. One engaged portion 74A is set longer than the other engaged portion 74B such that the movement of the engaged portion 74A is restricted by the third stopper portion 62a fit in the hole 40d.

A clearance A3 is provided between the third stopper portion 62a and the engaged portions 74A and 74B. The clearance A3 is smaller than overlapping width R (see FIG. 12) of the second stopper portions 45b and the engaged portions 74A and 74B. With this structure, it is possible to more surely prevent the engaged portions 74A and 74B and the second stopper portions 45b from being disengaged by mistake.

As explained above, the electronic apparatus 1 includes the holder 50 arranged along the rear surface of the main board 20 and the front surface of the sub-board 30. The holder 50 includes the connector holder portion 51 that holds the connector 59 in a position offset in the thickness direction of the main board 20 and the sub-board 30 from a position on the rear surface of the main board 20 and a position on the front surface of the sub-board 30. The holder 50 includes the cable holder portion 52 that holds the cable 58. With this structure, it is possible to optimize the position of the connector 59 in the thickness direction of the boards 20 and 30. It is possible prevent interference between the other electronic components (in the above explanation, the connectors 24, 25, and 39) and the cable 58.

The connector 59 is positioned traversing the plane P2 defined by the sub-board 30 in the thickness direction of the sub-board 30. With this layout of the connector 59, it is possible to reduce the thickness of the electronic apparatus 1.

The cutout 30a is formed at the edge of the sub-board 30. The connector 59 is located inside the cutout 30a. With this structure, it is possible to reduce the size of the electronic apparatus 1.

The cable holder portion 52 has the thickness smaller than the entire thickness of the connector 59 and the connector holder portion 51. The cable holder portion 52 is arranged between the main board 20 and the sub-board 30. With this structure, it is possible to reduce the distance between the main board 20 and the sub-board 30.

The connector holder portion 51 includes the portion located on the outer side of the outer edge of the main board 20. The portion of the connector holder portion 51 is fixed to the front housing body 63. In the example explained above, the attaching portion 51a located on the outer side of the outer edge of the main board 20 is fixed to the front housing body 63. With this structure, it is possible to prevent a load from being applied to the main board 20 through the connector 59 when the cable is connected to the connector 59 from the outside.

The cable holder portion 52 is arranged covering the connectors 24 and 25 mounted on the main board 20 and is attached to the main board 20. The cable holder portion 52 is arranged covering the connector 39 mounted on the sub-board 30 and is attached to the sub-board 30. With this structure, it is possible to improve the attachment stability of the connectors 24 and 25 to the main board 20 and the attachment stability of the connector 39 to the sub-board 30.

The present invention is not limited to the embodiment explained above. Various modifications of the embodiment are possible.

For example, the present invention may be applied to an electronic apparatus including only one of the main board 20 and the sub-board 30.

The holder 50 may hold, instead of the connector 59, a connector into which a portable storage medium can be inserted.

A cap may be provided in the connector 59. The cap may be removed according to necessity to expose the connector 59.

The cable holder portion 52 of the holder 50 may be attached to only one of the main board 20 and the sub-board 30.

In the above explanation, the structure for connecting the flat cable 70 to the sub-board 30 and the supporting structure for the sub-board 30 by the supporting protrusion 63a of the front housing body 63 are also explained. However, the present invention may be applied to an electronic apparatus not including the connecting structure for the flat cable 70 and the supporting structure by the supporting protrusion 63a.

What is claimed is:

1. An electronic apparatus comprising:
    a circuit board;
    a housing which houses the circuit board;
    an electronic component housed in the housing and exposable in a direction along the circuit board from an opening formed in the housing;
    a cable arranged in the housing and extending in a direction along the circuit board from the electronic component; and
    a holder arranged along one surface of the circuit board, the holder including a component holder portion which holds the electronic component in a position offset from a position on the one surface of the circuit board in a thickness direction of the circuit board, the holder further including a cable holder portion which holds the cable,
    wherein the cable holder portion holds the cable on one side of the holder and not an opposite side of the holder, and
    wherein the component holder portion s located on the one side of the holder.

2. The electronic apparatus according to claim 1, wherein the electronic component is positioned traversing a plane defined by the circuit board in the thickness direction of the circuit board.

3. The electronic apparatus according to claim 2, wherein a cutout is formed at an edge of the circuit board, and the electronic component is located inside the cutout.

4. The electronic apparatus according to claim 2, further comprising:
    a first circuit board; and
    a second circuit board arranged facing the first circuit board and functioning as the circuit board, wherein
    the cable holder portion has thickness smaller than entire thickness of the electronic component and the component holder portion and is arranged between the first circuit board and the second circuit board.

5. The electronic apparatus according to claim 2, wherein the component holder portion includes a portion located on an outer side of an outer edge of the circuit board and fixed to the housing.

6. The electronic apparatus according to claim 1, wherein the cable holder portion is arranged covering an electronic component mounted on the circuit board and is attached to the circuit board.

* * * * *